(12) United States Patent
Song et al.

(10) Patent No.: US 12,111,355 B2
(45) Date of Patent: Oct. 8, 2024

(54) SEMICONDUCTOR SUBSTRATE YIELD PREDICTION BASED ON SPECTRA DATA FROM MULTIPLE SUBSTRATE DIES

(71) Applicant: Onto Innovation Inc., Wilmington, MA (US)

(72) Inventors: Xin Song, Andover, MA (US); Jian Lu, Chelmsford, MA (US)

(73) Assignee: ONTO INNOVATION INC., Wilmington, MA (US)

( * ) Notice: Subject to any disclaimer, the term of this patent is extended or adjusted under 35 U.S.C. 154(b) by 185 days.

(21) Appl. No.: 17/532,700

(22) Filed: Nov. 22, 2021

(65) Prior Publication Data
US 2023/0160960 A1    May 25, 2023

(51) Int. Cl.
| | | |
|---|---|---|
| *G01R 31/3185* | (2006.01) | |
| *G01R 1/073* | (2006.01) | |
| *G01R 31/26* | (2020.01) | |
| *G01R 31/28* | (2006.01) | |
| *G06F 30/00* | (2020.01) | |
| *H01L 21/66* | (2006.01) | |

(52) U.S. Cl.
CPC .. *G01R 31/318511* (2013.01); *G01R 31/2642* (2013.01); *G01R 31/2831* (2013.01); *G01R 31/2886* (2013.01); *H01L 22/14* (2013.01); *G01R 1/07342* (2013.01); *G06F 30/00* (2020.01); *H01L 22/34* (2013.01); *H01L 2924/00* (2013.01); *H01L 2924/0002* (2013.01)

(58) Field of Classification Search
CPC ........ G01R 31/318511; G01R 31/2642; G01R 31/2894; G01R 31/308; G01R 31/2831; G01R 31/2886; G01R 1/07342; H01L 22/14; H01L 22/20; H01L 2924/00; H01L 2924/0002; H01L 22/34; G06F 30/00
USPC ...................................................... 324/762.05
See application file for complete search history.

(56) References Cited

U.S. PATENT DOCUMENTS

| | | |
|---|---|---|
| 5,513,275 A | 4/1996 | Khalaj |
| 6,274,394 B1 | 8/2001 | Cha |
| 6,969,619 B1 | 11/2005 | Winniczek |
| 7,525,659 B2 | 4/2009 | Furman |
| 8,873,050 B1 | 10/2014 | Flock |
| 8,954,184 B2 | 2/2015 | Kaushal |
| 9,036,895 B2 | 5/2015 | Sohn |
| 9,733,178 B2 | 8/2017 | Ryu |
| 10,079,183 B2 | 9/2018 | Gao |
| 10,430,719 B2 | 10/2019 | David |
| 10,438,825 B2 | 10/2019 | Jain |

(Continued)

FOREIGN PATENT DOCUMENTS

| | | |
|---|---|---|
| CN | 111189848 A | 5/2020 |
| CN | 111811652 A | 10/2020 |
| JP | 5869657 B2 | 5/2015 |

OTHER PUBLICATIONS

PCT/US2022/080261 International Search Report and Written Opinion dated Apr. 5, 2023 (10 pgs).

*Primary Examiner* — Raul J Rios Russo
(74) *Attorney, Agent, or Firm* — Merchant & Gould P.C.

(57) ABSTRACT

Systems and methods for improving substrate fabrication are provided. Subsets of dies of substrates may be inspected at various points in the fabrication process to generate spectra data. The spectra data can be used to generate data that are input to a machine learning model to predict yields for the substrates.

28 Claims, 8 Drawing Sheets

(56) References Cited

U.S. PATENT DOCUMENTS

| | | | |
|---|---|---|---|
| 10,490,462 B2 | 11/2019 | Pandev | |
| 10,502,694 B2 | 12/2019 | Dziura | |
| 10,504,759 B2 | 12/2019 | Kuznetsov | |
| 10,692,203 B2 | 6/2020 | Kong | |
| 2005/0085032 A1* | 4/2005 | Aghababazadeh | G01R 31/2831 438/232 |
| 2005/0090027 A1* | 4/2005 | Aghababazadeh | G01R 31/2831 257/E21.525 |
| 2012/0185813 A1 | 7/2012 | Kaushal et al. | |
| 2013/0057311 A1* | 3/2013 | Sakaguchi | H01L 22/14 324/759.03 |
| 2014/0011301 A1 | 1/2014 | Wang et al. | |
| 2017/0193400 A1 | 7/2017 | Bhaskar | |
| 2017/0200658 A1 | 7/2017 | Yang et al. | |
| 2017/0287751 A1 | 10/2017 | Kuznetsov et al. | |
| 2018/0157933 A1 | 6/2018 | Brauer et al. | |
| 2018/0342051 A1 | 11/2018 | Sezginer | |
| 2019/0286983 A1 | 9/2019 | Junf | |
| 2020/0064275 A1 | 2/2020 | Chao | |
| 2020/0203232 A1 | 6/2020 | Ryu | |
| 2020/0312778 A1 | 10/2020 | Lim | |
| 2020/0400589 A1 | 12/2020 | Feldman | |
| 2021/0239757 A1* | 8/2021 | Price | G01R 31/2872 |
| 2023/0204664 A1* | 6/2023 | Li | G01R 31/2894 324/762.05 |

* cited by examiner

|  | Wavelength 1 | Wavelength 2 | Wavelength 3 | .... | Wavelength N |
|---|---|---|---|---|---|
| Die 1, Time 1 | X | Y |  |  |  |
| Die 2, Time 1 | Z |  |  |  |  |
| Die 3, Time 1 |  |  |  |  |  |
| .... |  |  |  |  |  |
| Die M, Time 1 |  |  |  |  |  |

|  | Wavelength 1 | Wavelength 2 | Wavelength 3 | .... | Wavelength N |
|---|---|---|---|---|---|
| Die 1, Time 1 |  |  |  |  |  |
| Die 2, Time 1 |  |  |  |  |  |
| Die 3, Time 1 |  |  |  |  |  |
| .... |  |  |  |  |  |
| Die M, Time 1 |  |  |  |  |  |
| Die 1, Time 2 |  |  |  |  |  |
| Die 2, Time 2 |  |  |  |  |  |
| Die 3, Time 2 |  |  |  |  |  |
| .... |  |  |  |  |  |
| Die M, Time 2 |  |  |  |  |  |

62 ⟶ Die 1, Time 1
64 ⟶ Die 1, Time 2

SEMICONDUCTOR SUBSTRATE YIELD PREDICTION BASED ON SPECTRA DATA FROM MULTIPLE SUBSTRATE DIES

FIELD OF DISCLOSURE

The present disclosure is directed to semiconductor component manufacturing and metrology.

BACKGROUND

Semiconductor substrates are manufactured or fabricated as part of the formation of semiconductor chips or other types of integrated circuits (ICs). The components of the ultimate IC may be incorporated into the substrate through a series of fabrication steps. The fabrication steps may include deposition steps where a thin film layer is added onto the substrate. The substrate then may be coated with a photoresist and the circuit pattern of a reticle may be projected onto the substrate using lithography techniques. Etching processes may then occur. At each fabrication step, the tool performing the fabrication step may cause defects or imperfections on the substrate.

In some applications, a semiconductor substrate consists of dies. A die is a block of semiconducting material (e.g., silicon) on which a given functional circuit is fabricated. For example, a functional circuit can take the form of a central processing unit. A functional circuit can be batch manufactured on a single substrate. The substrate is then cut into dies, each containing one copy of the circuit. Each die can be rectangularly shaped. A thin, non-functional spacing can be provided between dies, allowing for cutting (e.g., with a saw) of individual dies from a substrate without damaging the circuits.

SUMMARY

In general terms, the present disclosure is directed to inspection of semiconductor substrates during manufacturing of the substrate. An example of a semiconductor substrate is a semiconductor wafer.

According to certain aspects, the present disclosure is directed to inspecting a subset of dies of a semiconductor substrate during manufacturing of the substrate.

According to certain other aspects, the present disclosure is directed to inspecting a subset of dies of a semiconductor substrate after multiple manufacturing steps during manufacturing of the substrate.

According to certain other aspects, the present disclosure is directed to inspecting a subset of dies of a semiconductor substrate by generating spectra data for each die of the subset.

According to certain other aspects, the present disclosure is directed to generating combined data containing spectra data for inspected dies of a semiconductor substrate. In some examples, the combined data can include an arrangement of differentiated subsets of data, each subset representing spectra data from one of the inspected dies. In some examples, the combined data can be represented as a matrix.

According to certain other aspects, the present disclosure is directed to generating combined data containing spectra data for inspected dies of a semiconductor substrate inspected after each of multiple manufacturing steps of the substrate. As used herein, terms such as manufacturing and fabrication or fabricating are used interchangeably.

According to certain other aspects, the present disclosure is directed to predicting a yield of a semiconductor substrate based on spectra data for inspected dies of the substrate.

According to certain other aspects, the present disclosure is directed to predicting a yield of a semiconductor substrate by inputting spectra data for inspected dies of the substrate into a trained machine learning model.

According to certain other aspects, the present disclosure is directed to predicting a yield of a semiconductor substrate by processing combined data containing spectra data for inspected dies of the substrate using a convolutional neural network.

According to certain other aspects, the present disclosure is directed to predicting a yield of a semiconductor substrate by processing combined data containing spectra data for inspected dies of the substrate inspected after each of multiple manufacturing steps of the substrate using a convolutional neural network.

According to certain other aspects, the present disclosure is directed to identifying a tool or process causing a defect in a semiconductor substrate.

According to certain other aspects, the present disclosure is directed to any combination of the foregoing features.

According to certain specific aspects, the present disclosure is directed to a method for predicting yield of a substrate, including: combining first spectra data for each a plurality of dies on the substrate and second spectra data for each of the plurality of dies of the substrate into combined data, the first data being generated from a first inspection of the plurality of dies at a first time, the second data being generated from a second inspection of the plurality of dies at a second time; and generating a predicted yield for the substrate, including providing the combined data as input to a trained machine learning model.

According to certain other specific aspects, the present disclosure is directed to non-transient computer-readable medium containing instructions for causing a computing device to: combine first spectra data for each a plurality of dies on the substrate and second spectra data for each of the plurality of dies of the substrate into combined data, the first data being generated from a first inspection of the plurality of dies at a first time, the second data being generated from a second inspection of the plurality of dies at a second time; and generate a predicted yield for the substrate, including to provide the combined data as input to a trained machine learning model.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Additional aspects, features, and/or advantages of examples will be set forth in part in the description which follows and, in part, will be apparent from the description, or may be learned by practice of the disclosure.

BRIEF DESCRIPTION OF THE DRAWINGS

Non-limiting and non-exhaustive examples are described with reference to the following figures.

DETAILED DESCRIPTION

Examples of the present disclosure describe systems and methods for improving substrate fabrication. An example of such a substrate is semiconductor wafer. An inspection device inspects a subset of dies of a substrate to identify defects in the substrate after the substrate has been processed by at least one fabrication tool. Based on the inspection data generated from the inspection process, a yield for the substrate is predicted. A yield of a substrate can refer to the percentage of dies of the substrate that would meet one or more defined operational, quality, or other acceptability criteria.

In some examples, the predicted yield can be used to identify a tool or process used in the manufacturing of the substrate that may be generating manufacturing defects in the substrate.

In some examples, the predicted yield can be used to improve manufacturing of the semiconductor substrates (e.g., by adjusting or replacing a tool causing a defect) based on the predicted yield to compensate for a defect.

One example inspection method for inspecting substrates and, particularly, of inspecting dies of substrates, involves generating spectra data for each of a subset of dies in the substrate. The spectra data can be generated using an inspection device or tool, such as a reflectometer or spectrometer that detects and measures wavelength spectra of light or other radiation reflected by that die. Thus, in some examples, the inspection tool is configured to generate multi-spectra imaging of the substrate.

For example, a substrate may have multiple dies, and those dies may be inspected at different steps in the manufacturing process, such as when a new layer is added to the substrate. Not each die on the substrate need be inspected as part of this process. An example substrate map 10 is shown schematically in FIG. 1. The substrate map 10 represents a semiconductor substrate during fabrication of the substrate. The example substrate map 10 indicates the locations of a subset of dies 12 of the substrate that may be inspected for purposes of predicting a yield for the substrate in accordance with the present disclosure. The dies of the substrate map other than the dies 12, such as the dies 14, are not inspected in this example.

The number and location of dies that are inspected to predict a yield of the substrate can be selected to optimize one or more factors. For example, inspecting fewer dies can be more cost and/or time effective but provide greater margin for error in the yield prediction. Similarly, inspecting dies that are relatively clustered on the substrate can be more cost and/or time effective than inspected dies that are scattered across the substrate, but again provide greater margin for error in the yield prediction of the overall substrate. Thus, the number and location of the dies that are inspected can be selected to minimize cost and time and maximize yield prediction accuracy and precision using a convolutional neural network (CNN) or other type of machine learning model. In some examples, the number of dies selected can be a predefined fraction of the total number of dies in the substrate, such as in a range from about one $1/50,000$ to about $1/1,000$. Fractions of total number of that are outside of this range may also be selected.

The CNN, or other machine learning model, can be trained (e.g., with supervised training) using spectra data from dies of substrates with known yields to predict an unknown yield of a target substrate based on spectra data from inspecting dies of the target substrate.

In some examples, the number of dies inspected on the target substrate for purposes of predicting yield of the target substrate is equal to the number of dies of each substrate used to train the CNN or other machine learning model.

In some examples, the locations of the dies inspected on the target substrate for purposes of predicting yield of the target substrate are the same as the locations of dies of each substrate used to train the CNN or other machine learning model.

In some examples, the number of dies and/or locations of dies inspected on the target substrate can differ from the number and/or location of dies of the training substrates.

Figure 1:
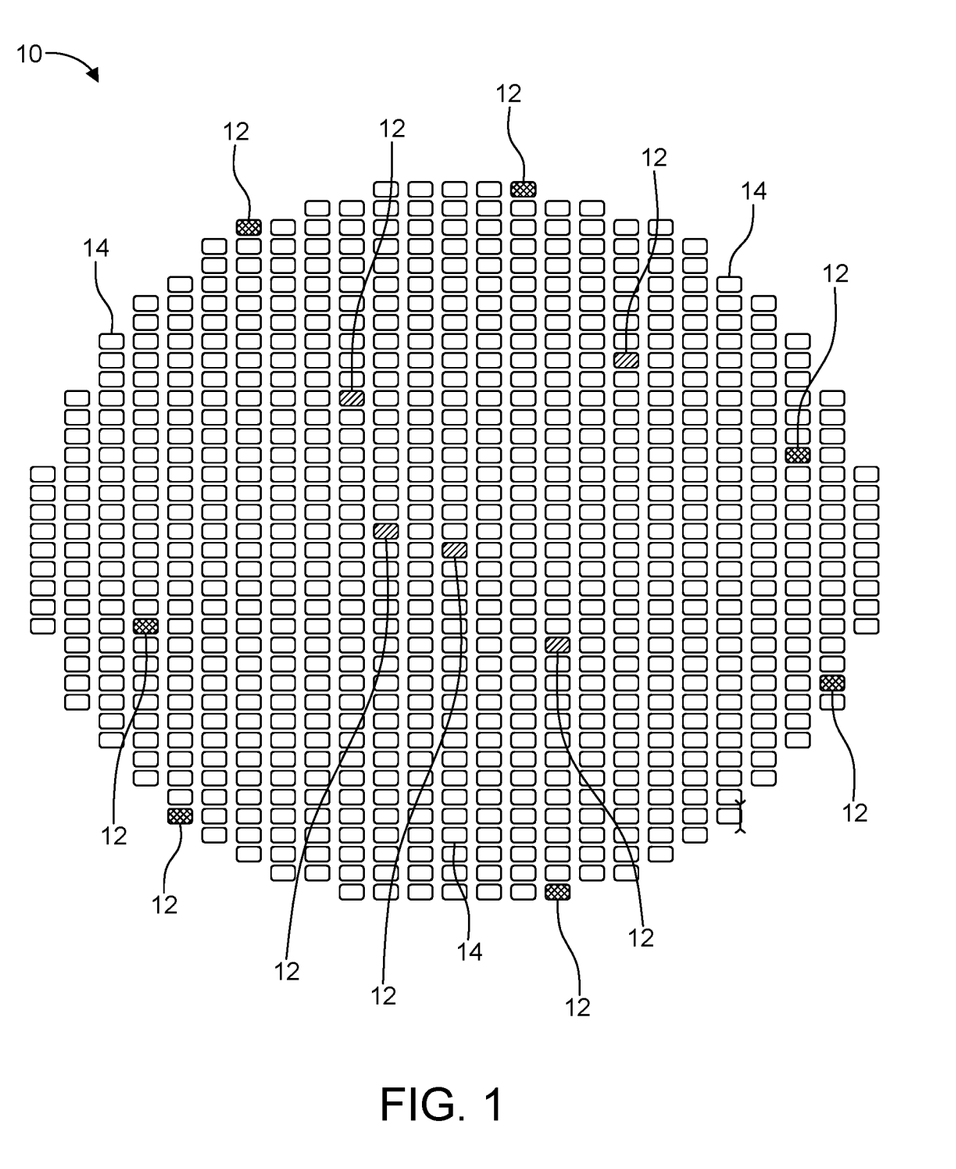
FIG. 1 depicts an example semiconductor substrate map representing a semiconductor substrate, the substrate including dies, a subset of which are selected for inspection in accordance with the present disclosure.

Still referring to FIG. 1, for each inspected die 12, spectra data is generated. The spectra data for each inspected die 12 can be one-dimensional serialized data from different wavelengths of electromagnetic radiation (e.g., different wavelengths of light). For instance, for each wavelength, a signal strength is represented in the data.

Other metrology tools can be used to inspect the dies of training substrates and generate spectra data for the dies 12 of the target substrate, such as acoustic or ultrasonic metrology tools.

In some examples, spectra data can be taken as a function of another spectra attribute, such as frequency, rather than wavelength.

Figure 2:
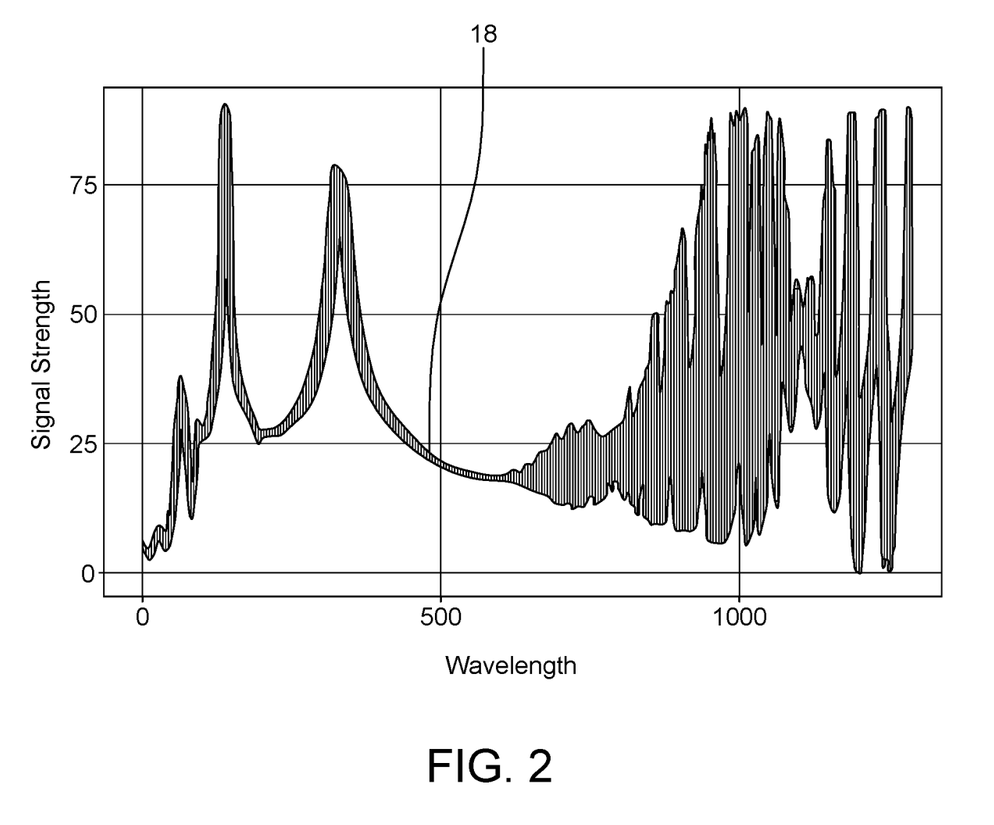
FIG. 2 depicts an example plot of spectra data for one of the inspected dies of FIG. 1.

FIG. 2 depicts an example plot 18 of visible light spectra data for a single die 12 of the substrate represented by the map 10 in FIG. 1, with the vertical axis representing signal strength of a signals reflected by the die 12 and the horizontal axis representing wavelength. The plot 18 can include multiple measurements taken by an inspection device (e.g., a reflectometer or spectrometer) at each measured wavelength. Each such signal measurement at a given wavelength of a given die following a given fabrication step (i.e., at a given inspection time) and at a given time can be considered a channel. The plot 18 can include reflected signal strengths for each of multiple channels at each of multiple reflected wavelengths (e.g., a thousand wavelengths or more). The multiple channels include signal measurements taken at different times, but of the same dies at the same wavelengths following the same substrate fabrication step. Thus, while "inspection time" is used herein to refer to an inspection of dies following a given fabrication step, at a single inspection time, multiple channels of data can be obtained to improve the reliability of the signal measurements, with each channel corresponding to a different measurement time but at the same inspection time. That is, at each inspection time, spectra data can be measured multiple times, each time corresponding to a discrete channel.

In some examples, one or more statistical operations can be applied to the detected signal strengths across the channels at a given wavelength to arrive at a singular signal strength value per wavelength, such as a median or mean signal strength across all channels per wavelength per die per inspection time. In some examples, if more than a maximum threshold variance in signal strength across the channels at a given wavelength is determined, then the spectra data, or a portion thereof, is not used, and/or the inspection is performed again.

Spectra data is generated for each inspected die on the substrate. For example, if spectra data from twelve dies 12 of the target substrate are used by the machine learning model to predict the model's yield, then twelve sets of spectra data are generated, one set of data for each inspected die 12.

The number of twelve dies is merely used as an example number, and other numbers of dies may be used. For example, the number of dies selected for inspection can be based on optimizing different factors. For example, inspecting more dies can improve the substrate yield prediction, but at the same time decrease the efficiency of the inspection process, by requiring more time to detect the spectra and more computing power to both train and apply a machine learning model that provides the prediction. Thus, for example, the number of dies selected for inspection to generate a predicted substrate yield can be based on an optimization of the error margin of the prediction as a function of the number or proportion of inspected dies. For instance, the number of dies selected for inspection for a given substrate can be the smallest number of dies that will generate a substrate yield prediction that has a margin of error no greater than a predefined threshold margin of error.

The locations on the substrate of the dies selected for inspection can be selected based on any number of factors. For example, the locations can be selected in order to provide the smallest number of dies needed for inspection in order for the substrate yield prediction to fall within the threshold margin of error. In some examples, the locations of the dies selected for inspection are selected randomly, e.g., using a random number generator or other randomizing tool.

The spectra data for the inspected dies is combined into combined data that can be provided as input to a machine learning model, such as a CNN, to predicted the yield for the substrate. An example of such combined data is a two-dimensional matrix. The yield for the substrate can be a percentage of dies on the substrate that will pass the final testing (i.e., the percentage of dies on the substrate that will have acceptable predefined operational or quality criteria). More specifically, the spectra data correlates with the presence or absence of die defects, which in turn correlates with substrate yield. Non-limiting examples of such defects can include uneven thickness of a deposited layer, cracks, improper dimensions, contamination, and so forth.

Multiple processes and tools can be used to fabricate substrates. The fabrication tools may include, for example, oxidation systems, epitaxial reactors, diffusion systems, ion implantation equipment, physical vapor deposition systems, chemical vapor deposition systems, photolithography equipment, and etching equipment, among other types of tools. The number of manufacturing steps employed to fabricate a substrate can vary from a small number (e.g., fewer than ten) up to hundreds, in some examples. Typically, a substrate may be fabricated by proceeding through a fabrication line, with each fabrication tool in the fabrication line performing a process step on the substrate. The same tool can be used multiple times in the fabrication line. For instance, multiple deposition, lithography, and/or etching steps may be performed to fabricate a substrate.

In some examples, the spectra data can also correlate with types of die defects, which in turn correlates with substrate yield. For example, certain defects may impact acceptability of a substrate more or less than other types. If the type of defect is known, it can be weighted according to its impact on substrate acceptability when predicting a yield of the substrate using a machine learning model. In some examples, the type of defect can be determined based on the fabrication step performed most recently prior to the substrate inspection. For instance, if spectra data is taken following a deposition step, then to the extent that spectra data indicates a defect in the substrate dies, the defect may be a deposition type defect and/or a defect associated with a deposition tool. An appropriate weighting factor can then be applied by the machine learning model to the detected deposition type defect when predicting the substrate yield using the spectra data.

A machine learning model such as a CNN can be trained, using the correlations, to predict a yield of a target substrate, based on spectra data for dies of the substrate. For example, the machine learning model can be trained using training substrates with known yields to predict the yield of a target substrate by comparing the spectra data for the dies of the target substrate (such as the plot shown in FIG. 2) with corresponding spectra data (e.g., for a corresponding die and/or for following the same fabrication step) of training substrates with known yields. The machine learning model can then categorize the yield of the target substrate using the compared spectra data of the training substrates with known yields to provide an output yield prediction for the target substrate.

Spectra data can be combined in any suitable combined number arrangement, and the arrangement can be provided as input to a machine learning model such as a CNN. For example, the combined data can include, for each die, a subset of data that represents the spectra data corresponding to that die. The subsets of data in the combined data arrangement can be organized such that each subset of data is differentiated from every other subset of data in the arrangement. Each data value in each subset of data is associated with a wavelength of the corresponding spectra data of the corresponding die and represents a signal strength at the associated wavelength of the corresponding spectra data of the corresponding die.

Figure 3:
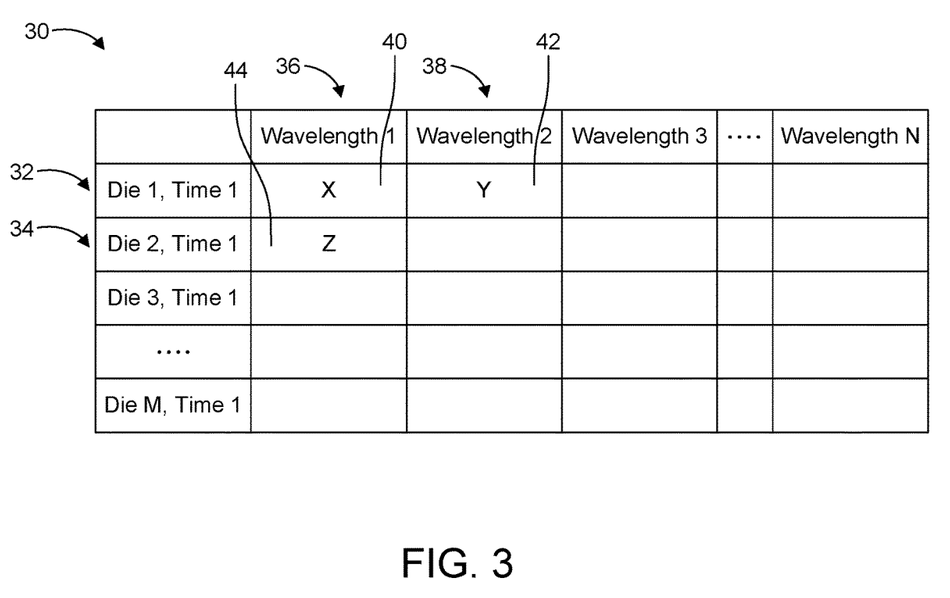
FIG. 3 depicts a portion of an example matrix of spectra data that can be used to generate a substrate yield prediction in accordance with the present disclosure.

Non-limiting examples of combined data arrangements organized with subsets of data as just described include matrices. FIG. 3 depicts a portion of an example matrix 30 of spectra data that can be input to a machine learning model to generate a target substrate yield prediction in accordance with the present disclosure. The matrix 30 is an example arrangement or construct of combined differentiated subsets of data corresponding to spectra data.

The matrix 30 includes spectra data for dies of a target substrate following a fabrication step of the target substrate. All of the spectra data in the matrix 30 is taken at a Time 1, or Inspection Time 1, meaning that all of the data in the matrix 30 is taken after a given fabrication step and before a next fabrication step or next other step that would physically alter the substrate.

Once completed, the matrix 30 (or other arrangement of the combined spectra data) can be provided as input to a machine learning model to predict a yield of the substrate. In some examples, the matrix 30 (or other arrangement of the combined spectra data) is assigned one or more attributes that the machine learning model can use to more accurately predict substrate yield. For example, the matrix 30 (or other arrangement of the combined spectra data) can be assigned a fabrication step attribute that identifies the type of fabrication step performed immediately prior to obtaining the spectra data contained in the matrix 30 (or other arrangement of the combined spectra data).

Each horizontal row of the matrix 30 represents a different inspected die of the target substrate following the fabrication step. For example, if twelve dies are inspected, the matrix 30 has twelve rows, with M being 12. Thus, in an example, the first row 32 of the matrix 30 can represent all the spectra data for the first inspected die 12 (FIG. 1), the second row 34 of the matrix 30 can represent all the spectra data for the second inspected die 12 (FIG. 1), and so forth. Each inspected die has a location on the substrate, or die location, unique to that die.

Each vertical column of the matrix 30 represents a different spectra wavelength. For example, the first column 36 may represent a first wavelength, the second column 38 may represent a second wavelength that is different from the first wavelength, and so forth. In other examples, each column represents a different spectra frequency.

Each cell of the matrix 30 includes the measured reflected signal strength for the corresponding die at the corresponding wavelength at the corresponding inspection time. Thus, for example, the value x in the cell 40 of the matrix 30 corresponding to the row 32 and the column 36 corresponds to the measured reflected signal strength at a first wavelength for a first inspected die 12 (FIG. 1) at Inspection Time 1. The value y in the cell 42 of the matrix 30 corresponding to the row 32 and the column 38 corresponds to the measured reflected signal strength at the second wavelength for the first inspected die 12 at Time 1. The value z in the cell 44 of the matrix 30 corresponding to the row 34 and the column 36 corresponds to the measured reflected signal strength at the first wavelength for the second inspected die at Time 1, and so forth, for each of the inspected dies 12 (FIG. 1) of the substrate, and each of the inspected wavelengths of the spectra.

In some examples, the matrices generated according to the present disclosure can be assembled into three-dimensional constructs, with a third dimension corresponding to inspection channels, such that each cell of each matrix includes a value corresponding to the spectra signal strength at a given wavelength for a given channel for a given die at a given inspection time. In some examples, the three-dimensional construct is converted into a two-dimensional matrix, e.g., by performing one or more statistical operations on the data across channels for a given die, a given wavelength, and a given inspection time, as described above.

The number of inspected wavelengths (or frequencies, in some examples) can be, e.g., on the order of 10, on the order 100, or on the order of 1,000, or greater. In some examples, there are about 1,000 (N is about 1,000) inspected wavelengths for each of the spectra, such that each die at each inspection time is associated with about 1,000 spectra data points, and such that the matrix 30 includes approximately 1,000 columns, and with each data point being a signal strength measured by a reflectometry or spectrometry device at the given wavelength.

The completed matrix 30 (e.g., with every cell containing signal strength data), or other arrangement of the combined spectra data, may be provided as input to a machine learning model to generate a prediction of the yield for the substrate. In some examples, the machine learning model may be trained via a supervised training method based on prior matrices (or other arrangements of combined spectra data) from substrates with known yields. In some examples, the machine learning model is a convolutional neural network. In some examples, the training matrices are the same size as the matrix 30.

The matrix (or other arrangement of the combined spectra data) that is input to the machine learning model can be augmented at different fabrication steps. That is, another set, or sets, of spectra data can be generated by inspecting the same dies of the substrate at a second inspection time and, optionally, one or more other following inspection times, following one or more other fabrication steps. For instance, after a first layer of the substrate is manufactured, an inspection of the twelve dies may occur. The twelve-row matrix 30 (FIG. 3) may then be generated as described above using spectra data generated from the inspection at Time 1.

Figure 4:
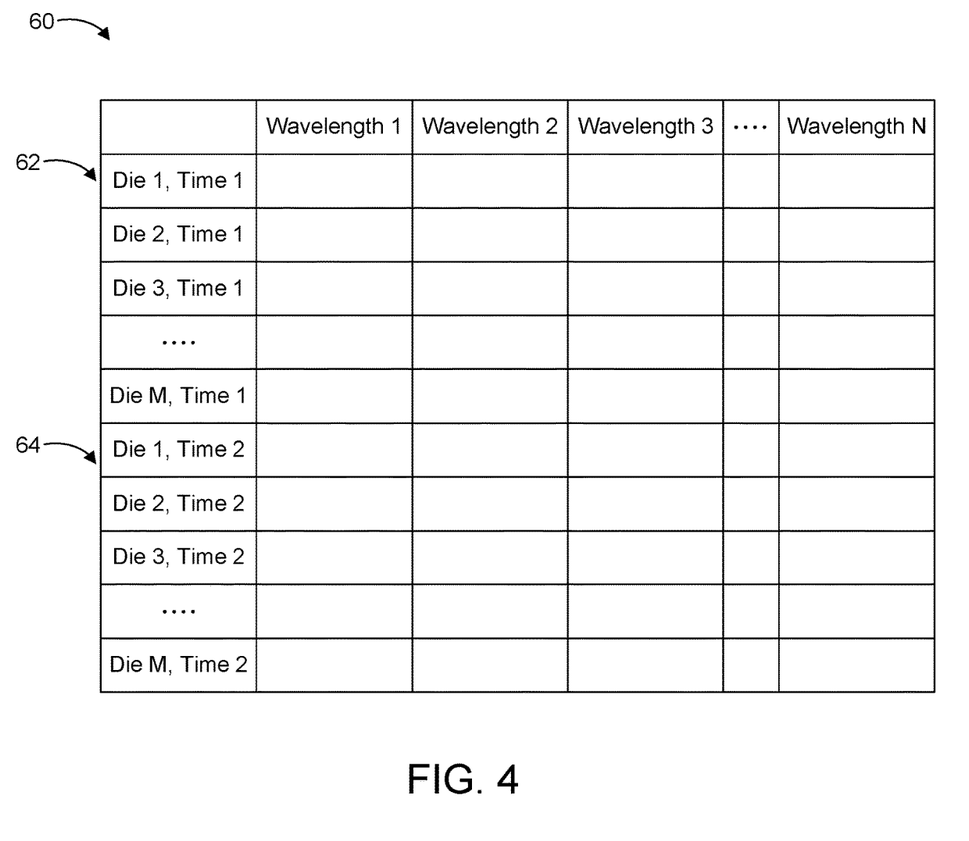
FIG. 4 depicts a portion of a further example matrix of spectra data that can be used to generate a substrate yield prediction in accordance with the present disclosure.

After another layer of the substrate is manufactured, or another fabrication step (e.g., etching), takes place, and before a next fabrication step or next other step that would physically alter the substrate, a second inspection at an Inspection Time 2 (or Time 2) of the twelve dies can occur. The matrix 30 (FIG. 3) generated from the first inspection may be augmented with spectra data from the second inspection to generate an augmented matrix 60 (FIG. 4). For instance, another twelve rows may be added to the matrix 30 to generate the matrix 60, one additional row per inspected die. Accordingly, the first row 62 of the matrix 60 represents the spectra data for the first die after the first manufacturing step (i.e., at Inspection Time 1), and the thirteenth row 64 of the matrix 60 represents the spectra data for the first die after the second manufacturing step (i.e., at Inspection Time 2).

In some examples, the same dies are inspected at the first inspection time and the second inspection time. In some examples, the same number of dies are inspected at the first inspection time and the second inspection time, but the dies inspected at the second inspection time need not all be the same as the dies inspected at the first inspection time.

The augmented matrix 60 (or other augmented arrangement of combined differentiated subsets of data) may be provided as input to the machine learning model (e.g., a CNN) to predict the yield of the substrate after the second manufacturing step. The process may continue with augmentation of the matrix occurring after each of any desired number of manufacturing steps and corresponding inspection of the substrate. Thus, updated yield predictions can be made after each manufacturing step with further augmented data. With each augmentation supplied to the machine learning model, the machine learning model compares the input to training matrices (or other data arrangements) having corresponding levels of augmentation following the same manufacturing steps as for the target substrate.

As an alternative to augmenting the matrix 30 of FIG. 3 to include spectra data following another manufacturing step, separate matrices can be generated for each inspection time and input to the machine learning model as separate matrices that are compared to corresponding training matrices.

As a further alternative to augmenting the matrix 30 of FIG. 3 to include spectra data following another manufacturing step, just the matrix 60 can be generated following both manufacturing steps, and without first generating the matrix 30.

In some examples, a first predicted yield for a substrate is generated by inputting the matrix 30 (or other arrangement of combined spectra data) into a machine learning model. Then another manufacturing step is performed on the substrate and another inspection is performed. Spectra data from the another inspection are then added to the matrix 30 (or other arrangement of combined spectra data) to generate the augmented matrix 60 (or other augmented arrangement of combined spectra data). The augmented matrix (or other augmented arrangement of combined spectra data) is then input to the machine learning model to modify the first predicted yield and output a second predicted yield for the substrate that is a modification of the first predicted yield based on the augmentation of the matrix (or other arrangement of combined spectra data).

A matrix (e.g., the matrix 30) (or other arrangement of combined spectra data) or augmented matrix (e.g., the matrix 60) (or other augmented arrangement of combined spectra data) with spectra data for dies of a target substrate are input to a machine learning model, and the machine learning model performs one or more operations (e.g., matrix operations) on the input in order to categorize the input. The one or more operations can generate one or more values that can be compared to corresponding values of training substrates with known yields to thereby output a predicted yield for the target substrate.

The matrix (e.g., the matrix 30) or augmented matrix (e.g., the matrix 60) can be constructed in a data file using delimiters to separate columns and rows.

By predicting substrate yield during manufacture of the substrate, advantageous efficiencies can be gained using systems and methods of the present disclosure. For example, defect causing manufacturing tools or processes can be identified, and corrected or resolved sooner, e.g., before completing manufacture of the substrate or a batch of substrates. In addition, it can be determined relatively early in the manufacturing process approximately how many substrates may be impacted by a defect.

In addition, by re-evaluating substrate yield predictions after each of multiple manufacturing steps of a substrate, improvements in the accuracy of substrate yield prediction can be obtained, which can further result in improved efficiencies, minimizing unneeded disposal of acceptable substrates and increasing efficient disposal of substrates that might otherwise have been given an unwarranted passing score based on fewer inspection data. For example, the impact of a defect after a given manufacturing step may be impacted (e.g., reduced or magnified) following a subsequent manufacturing step. Embodiments of the present disclosure are adapted to capture and evaluate that impact to refine a yield prediction of the substrate using augmented spectra data matrices (or other data arrangements) as described herein.

Figure 5:
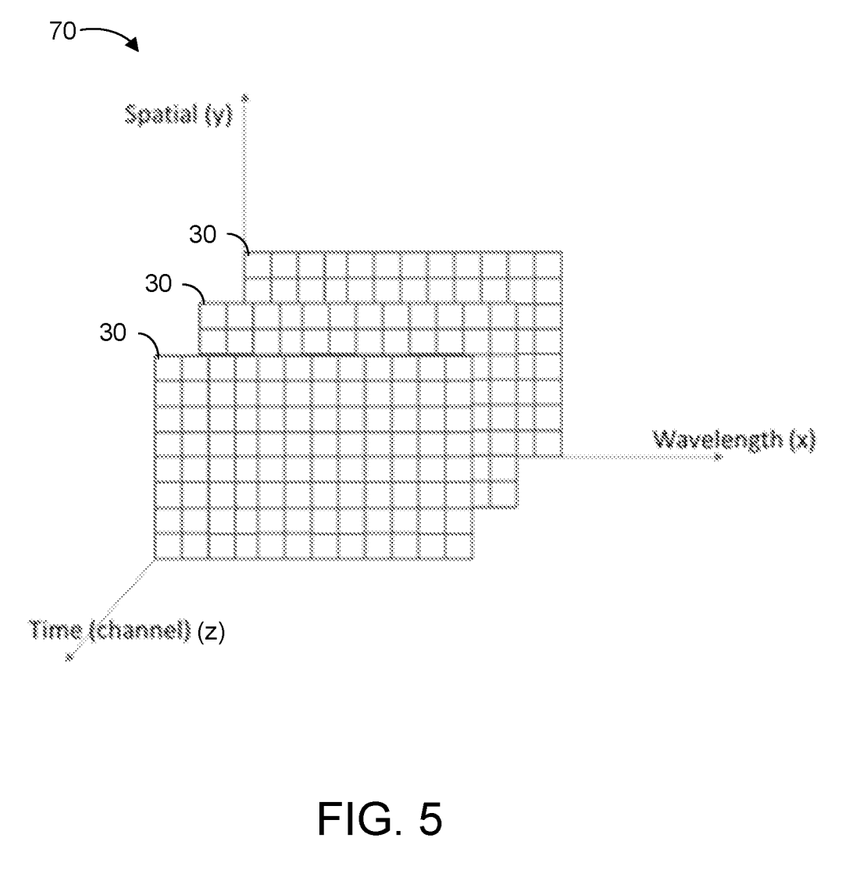
FIG. 5 depicts an example three-dimensional construct of spectra data that can be used to generate a substrate yield prediction in accordance with the present disclosure.

FIG. 5 depicts an example three-dimensional construct 70 of spectra data that can be used to generate a substrate yield prediction in accordance with the present disclosure. The three-dimensional construct 70 includes a series of two-dimensional matrices, with each two-dimensional matrix including spectra data from dies of a substrate taken at a different time following the same fabrication step. That is, each two-dimensional matrix 30 represents data from a different channel. Referring to FIG. 5, the (x) axis corresponds to spectra wavelength, as do the rows of each matrix 30 (FIG. 3). The (y) axis is the spatial axis in that it corresponds to different dies on the substrate, as do the columns of each matrix 30 (FIG. 3). The (z) axis is the channel axis, with each channel corresponding to measurements taken at a different time.

In some examples, the two-dimensional matrices of the three-dimensional construct 70 correspond to multiple of the matrices 30 (FIG. 3), with each such matrix 30 being populated with signal strength measurements taken at a different time, i.e., a different channel, for the single inspection time.

The completed three-dimensional construct 70 (e.g., with every cell of every two-dimensional matrix 30 containing signal strength data) may be provided as input to a machine learning model to generate a prediction of the yield for the substrate. In some examples, the machine learning model may be trained via a supervised training method based on prior three-dimensional constructs from substrates with known yields. In some examples, the machine learning model is a convolutional neural network. In some examples, the training constructs are the same size as the construct 70 (e.g., the same number and size of two dimensional matrices).

Figure 6:
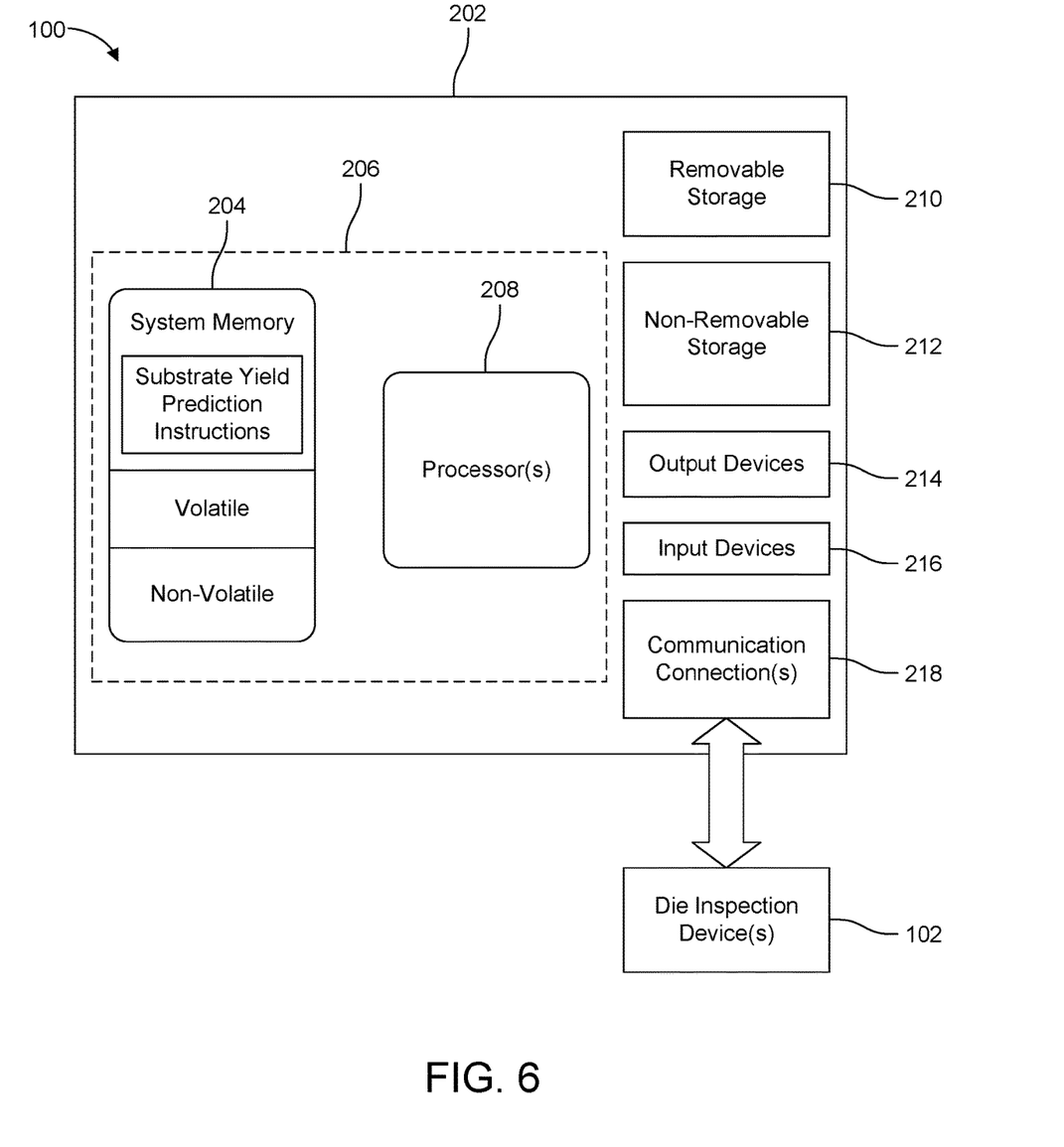
FIG. 6 schematically depicts an example system for predicting yield of a semiconductor substrate in accordance with the present disclosure.

FIG. 6 schematically depicts an example system 100 for predicting yield of a semiconductor substrate in accordance with the present disclosure.

The system 100 includes a computing device 202. The computing device 202 may be a server and/or other computing device that performs the operations discussed herein, such as the substrate yield prediction operations described herein. The computing device 202 may include computing components 206. The computing components 206 include at least one processor 208 and memory 204. The memory 204 can include a non-transient computer readable medium. Depending on the exact configuration, memory 204 (storing, among other things, substrate yield prediction instructions and instructions to perform the other operations disclosed herein) can be volatile (such as RAM), non-volatile (such as ROM, flash memory, etc.), or some combination of the two. Further, the server 202 may also include storage devices (removable 210, and/or non-removable 212) including, but not limited to, solid-state devices, magnetic or optical disks, or tape. Further, the computing device 202 may also have input device(s) 216 such as touch screens, keyboard, mouse, pen, voice input, etc., and/or output device(s) 214 such as a display, speakers, printer, etc. One or more communication connections 218, such as local-area network (LAN), wide-area network (WAN), point-to-point, Bluetooth, RF, etc., may also be incorporated into the computing device 202.

The system 100 can include one or more die inspection devices 102 that is/are in operative communication with, e.g., linked via a network to, the computing device 202. A non-limiting example of a die inspection device 102 is a reflectometer or spectrometer that measures intensity of light or other waves (e.g., sound waves) reflected from a substrate at different wavelengths and generates spectra data, such as the spectra data shown in FIG. 2.

In alternative configurations, one or more components of the computing device 202 reside locally on the one or more die inspection devices 102. For example, the one or more die inspection devices 102 can be configured to themselves perform one or more of the substrate yield operations described herein. That is, the substrate yield prediction instructions can be run directly on the one or more die inspection devices 102.

Figure 7:
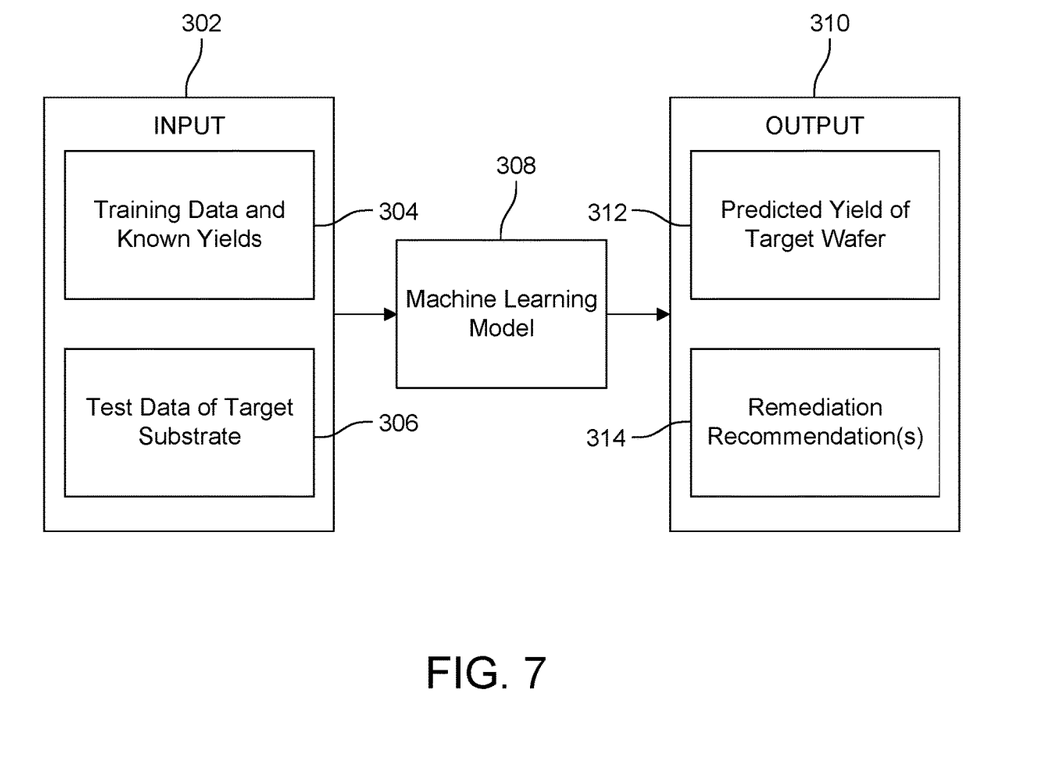
FIG. 7 depicts an example of using a machine learning model to predict substrate yield in accordance with examples of the present disclosure using the system of FIG. 6.

FIG. 7 depicts an example of using a machine learning model to predict substrate yield in accordance with examples of the present disclosure using the system of FIG. 6. In some examples, one or more of the operations performed in FIG. 7 can be performed by the computing device 202 and/or the one or more die inspection devices 102 of FIG. 6.

Referring to FIG. 7 generally, input 302 is provided to a machine learning model 308, such as a CNN. The CNN is configured to analyze the input to generate an output 310, that can be provided (e.g., displayed on a display device) to a technician using the computing device 202 of FIG. 6.

The input 302 includes training data (such as training matrices) and known yields 304, and test data or target data (e.g., a test matrix or target matrix) 306. The training data can include augmented and/or non-augmented combinations of spectra data (e.g., in the form of matrices as described above) of training substrates, with a known substrate yield corresponding to each training data input.

The test data (e.g., test matrix) 306 can be an augmented or non-augmented combination of spectra data (e.g., in the form of a matrix as described above) of a target substrate with an unknown yield.

The machine learning model 308 is trained using the training data and known yields 304. The machine learning model 308 operates on the test data 306, using the training matrices and known yields 304, to generate the output 310.

The output 310 includes a predicted yield 312 for the target substrate corresponding to the test data 306. In some examples, the predicted yield can also include an indication as to whether the predicted yield passes or fails one or more predefined operational, quality, or other acceptability.

In some examples, the output 310 can include one or more remediation recommendations 314. If a predicted yield 312 correlates to a failing score for the substrate, for example, one or more remediation actions can be suggested. The recommended remediation(s) can be based on, e.g., the degree to which the predicted yield falls short of a minimum threshold yield of acceptability, the most recent manufacturing step performed, and/or other factors. For example, a remediation recommendation 314 can be to recalibrate the substrate manufacturing tool used immediately prior to the generation of the test data 306. In another example, the remediation recommendation 314 can be to discard the target substrate, or partially formed target substrate. Other remediation recommendations 314 are possible.

Figure 8:
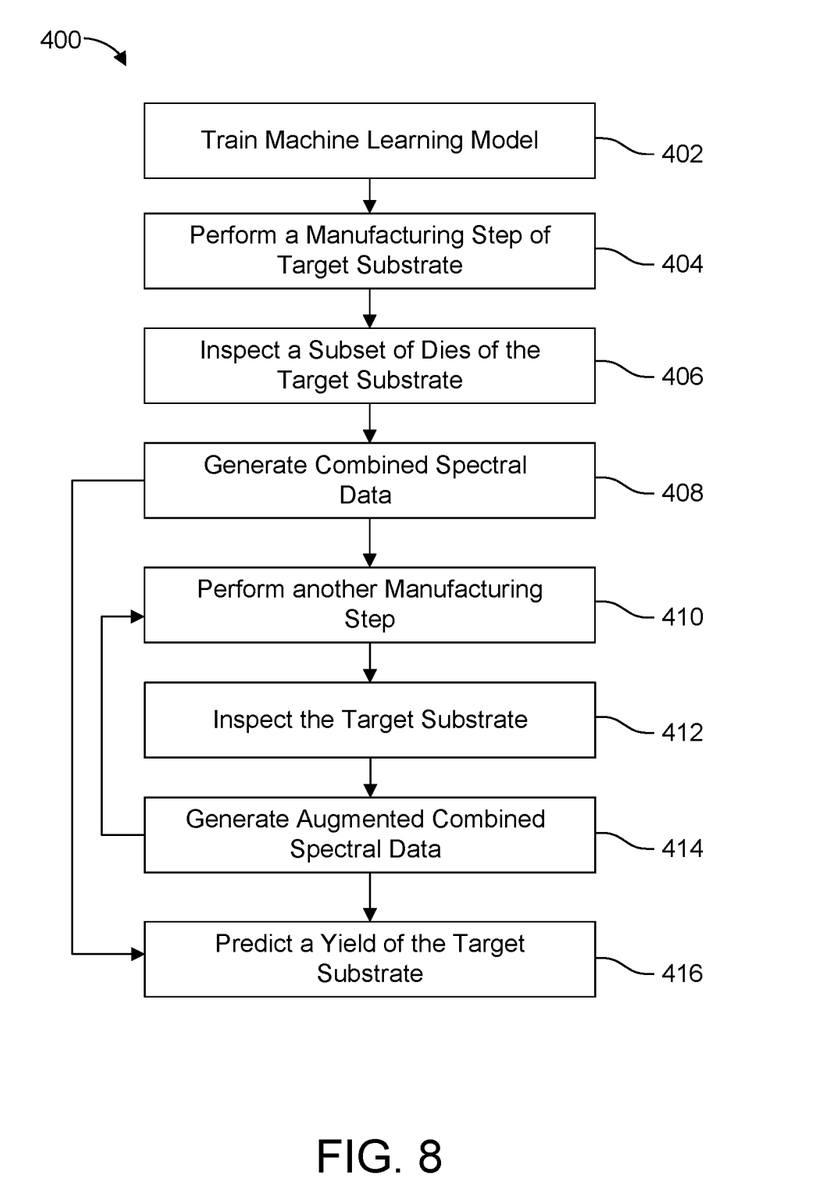
FIG. 8 depicts methods of predicting a yield of a semiconductor substrate using the system of FIG. 6.

FIG. 8 depicts methods 400 of predicting a yield of a semiconductor substrate using the system of FIG. 6. It will be appreciated that different embodiments of the present disclosure may include different combinations of subsets of the steps of the method 400, non-limiting examples of which are described herein.

At a step 402 of the method 400, a machine learning model is trained using spectra data (e.g., spectra data matrices) generated by inspecting dies (e.g., with a die inspection device 102 (FIG. 6)) of training substrates having known yields.

At a step 404 of the method 400, a manufacturing step of a target substrate is performed.

At a step 406, a subset of dies of the target substrate are inspected, e.g., using a die inspection device 102 (FIG. 6).

At a step 408, a spectra data is combined (e.g., in the form of a matrix, such as the spectra data matrix 30 (FIG. 3)) based on the inspection performed at the step 406. In some examples, the step 408 includes accessing the spectra data generated at the step 406 and generating the combined spectra data using the accessed spectra data.

In some examples, following the step 408, the method 400 proceeds to the step 416, at which the machine learning model uses the spectra data generated at the step 408 and the training data obtained at the step 402 to predict a yield for the target substrate. In some examples, following the step 408, the method 400 proceeds to the step 410.

At a step 410, another manufacturing step is performed on the target substrate.

At a step 412, the same subset of dies of the target substrate as in the step 406 are inspected, e.g., using a die inspection device 102 (FIG. 6).

At a step 414, augmented combined spectra data (e.g., an augmented spectra data matrix such as the matrix 60 (FIG. 4) or the matrix 70 (FIG. 5)) is generated based on the inspection performed at the step 412. In some examples, the step 414 includes accessing the spectra data generated at the step 412 and generating the augmented spectra data using the accessed spectra data generated at the step 412.

In some examples, following step 414 the method repeats, one or more times, and in sequence, the steps 410, 412 and 414, to further augment the spectra data following further manufacturing steps of the target substrate.

Following the step 414, or the last instance of the step 414, at a step 416, the machine learning model uses the spectra data generated at the most recently performed iteration of the step 414, and the training data obtained at the step 402, to predict a yield for the target substrate. In some examples, the steps 410, 412, 414, and 416 are repeated to predict a yield for the target substrate after each fabrication step or after a certain number of fabrication steps.

In other examples, a predicted yield can be generated after the step 408, and in some examples, that predicted yield can then be modified following one or more instances of the step 414.

The embodiments described herein may be employed using software, hardware, or a combination of software and hardware to implement and perform the systems and methods disclosed herein. Although specific devices have been recited throughout the disclosure as performing specific functions, one of skill in the art will appreciate that these devices are provided for illustrative purposes, and other devices may be employed to perform the functionality disclosed herein without departing from the scope of the disclosure. In addition, some aspects of the present disclosure are described above with reference to block diagrams and/or operational illustrations of systems and methods according to aspects of this disclosure. The functions, operations, and/or acts noted in the blocks may occur out of the order that is shown in any respective flowchart. For example, two blocks shown in succession may in fact be executed or performed substantially concurrently or in reverse order, depending on the functionality and implementation involved.

This disclosure describes some embodiments of the present technology with reference to the accompanying drawings, in which only some of the possible embodiments were shown. Other aspects may, however, be embodied in many different forms and should not be construed as limited to the embodiments set forth herein. Rather, these embodiments were provided so that this disclosure was thorough and complete and fully conveyed the scope of the possible embodiments to those skilled in the art. Further, as used herein and in the claims, the phrase "at least one of element A, element B, or element C" is intended to convey any of: element A, element B, element C, elements A and B, elements A and C, elements B and C, and elements A, B, and C. Further, one having skill in the art will understand the degree to which terms such as "about" or "substantially" convey in light of the measurement techniques utilized herein. To the extent such terms may not be clearly defined or understood by one having skill in the art, the term "about" shall mean plus or minus ten percent.

Although specific embodiments are described herein, the scope of the technology is not limited to those specific embodiments. Moreover, while different examples and embodiments may be described separately, such embodiments and examples may be combined with one another in implementing the technology described herein. One skilled in the art will recognize other embodiments or improvements that are within the scope and spirit of the present technology. Therefore, the specific structure, acts, or media are disclosed only as illustrative embodiments. The scope of the technology is defined by the following claims and any equivalents therein.

What is claimed is:

1. A method for predicting yield of a substrate, the method comprising:
   combining first spectra data for a first die of a plurality of dies on the substrate and second spectra data for the first die of the plurality of dies on the substrate into combined data, the first spectra data for the first die being generated from a first inspection of only the first die of the plurality of dies at a first time, the second spectra data for the first die being generated from a second inspection of only the first die of the plurality of dies at a second time, the second time being different from the first time; and
   generating, based on the combined data, a predicted yield for the substrate, including providing the combined data as input to a trained machine learning model.

2. The method of claim 1, wherein the machine learning model is a convolutional neural network.

3. The method of claim 1, wherein the combined data includes a first subset of data that represents the first spectra data for the first die of the plurality of dies.

4. The method of claim 3, wherein the combined data is organized so that the first subset of data is differentiated from a second subset of data that represents second spectra data for a second die of the plurality of dies.

5. The method of claim 4, wherein each data value of the first subset of data is associated with a wavelength of the first spectra data.

6. The method of claim 5, wherein a data value in the first subset of data represents a signal strength of the first spectra data, at the wavelength corresponding to the data value, for the first die of the plurality of dies.

7. The method of claim 1,
   wherein the first time occurs after a first manufacturing step is performed on the substrate and before a second manufacturing step is performed on the substrate; and
   wherein the second time occurs after the second manufacturing step is performed on the substrate.

8. The method of claim 1, further comprising:
   augmenting the combined data by adding third spectra data for the first die of the plurality of dies into the combined data to form augmented combined data, the third spectra data being generated from a third inspection of the first die of the plurality of dies; and
   generating another predicted yield for the substrate, including providing the augmented combined data as input to the trained machine learning model,
   wherein the first time occurs after a first manufacturing step is performed on the substrate and before a second manufacturing step is performed on the substrate;
   wherein the second time occurs after the second manufacturing step is performed on the substrate and before a third manufacturing step is performed on the substrate; and
   wherein the third time occurs after the third manufacturing step is performed on the substrate.

9. The method of claim 1, wherein each of the first spectra data and the second spectra data includes additional spectra data for each of the plurality of dies, and wherein the plurality of dies are less than all dies on the substrate.

10. The method of claim 1,
    wherein the combined data is augmented combined data;
    wherein the predicted yield is a modified predicted yield, the method further comprising, before the second inspection:
       generating non-augmented combined data including the first spectra data; and
       providing the non-augmented combined data as input to the trained machine learning model to generate a first predicted yield for the substrate, the method further comprising, after the second inspection:
       modifying the first predicted yield to generate the modified predicted yield.

11. The method of claim 1, further comprising:
    generating a remediation recommendation based on the predicted yield.

12. The method of claim 11, wherein the remediation recommendation includes a recommendation to adjust a substrate manufacturing tool.

13. The method of claim 1, further comprising, prior to the combining, generating the first spectra data and the second spectra data.

14. The method of claim 9, wherein the plurality of dies is in a range from $1/1000$ to $1/50,000$ of a total number of dies of the substrate.

15. The method of claim 6, further comprising training a machine learning model to provide the trained machine learning model, including inputting training matrices to the machine learning model, each of the training matrices including a first dimension corresponding to different training dies, a second dimension corresponding to different spectra wavelengths, and a third dimension corresponding to different inspection channels, the training matrices including, for each of the different channels, values of reflected signal strengths of the different training dies at the different spectra wavelengths.

16. The method of claim 8, wherein the augmenting includes adding one or more rows of a data corresponding to the third spectra data to a matrix.

17. A non-transient computer-readable medium containing instructions for causing a computing device to:
    combine first spectra data for a first die of a plurality of dies of a substrate and second spectra data for the first die of the plurality of dies on the substrate into combined data, the first spectra data for the first die being generated from a first inspection of only the first die of the plurality of dies at a first time, the second spectra data being generated from a second inspection of only the first die of the plurality of dies at a second time, the second time being different from the first time; and
    generate, based on the combined data, a predicted yield for the substrate, including to provide the combined data as input to a trained machine learning model.

18. The non-transient computer-readable medium of claim 17, wherein the machine learning model is a convolutional neural network.

19. The non-transient computer-readable medium of claim 17,
    wherein the combined data includes a first subset of data that represents the first spectra data for the first die of the plurality of dies;
    wherein the combined data is organized so that the first subset of data is differentiated from a second subset of data that represents second spectra data for a second die of the plurality of dies;

wherein each data value of the first subset of data is associated with a wavelength of the first spectra data; and wherein a data value in the first subset of data represents a signal strength of the first spectra data, at the wavelength corresponding to the data value, for the first die of the plurality of dies.

20. The non-transient computer-readable medium of claim 17,
wherein the first time occurs after a first manufacturing step is performed on the substrate and before a second manufacturing step is performed on the substrate; and
wherein the second time occurs after the second manufacturing step is performed on the substrate.

21. The non-transient computer-readable medium of claim 17, containing further instructions configured for causing the computing device to:
augment the combined data by adding third spectra data for the first die of the plurality of dies into the combined data to form augmented combined data, the third spectra data being generated from a third inspection of the first die of the plurality of the dies; and
generate another predicted yield for the substrate, including to provide the augmented combined data as input to the trained machine learning model,
wherein the first time occurs after a first manufacturing step is performed on the substrate and before a second manufacturing step is performed on the substrate;
wherein the second time occurs after the second manufacturing step is performed on the substrate and before a third manufacturing step is performed on the substrate; and
wherein the third time occurs after the third manufacturing step is performed on the substrate.

22. The non-transient computer-readable medium of claim 17, wherein each of the first spectra data and the second spectra data includes additional spectra data for each of the plurality of dies, and wherein the plurality of dies are less than all dies on the substrate.

23. The non-transient computer-readable medium of claim 17,
wherein the combined data is augmented combined data;
wherein the predicted yield is a modified predicted yield,
the non-transient computer-readable medium containing further instructions configured for causing the computing device to, before the second inspection:
generate non-augmented combined data including the first spectra data; and
provide the non-augmented combined data as input to the trained machine learning model to generate a first predicted yield for the substrate,
the non-transient computer-readable medium containing further instructions configured for causing the computing device to, after the second inspection:
modify the first predicted yield to generate the modified predicted yield.

24. The non-transient computer-readable medium of claim 17, containing further instructions configured for causing the computing device to:
generate a remediation recommendation based on the predicted yield.

25. The non-transient computer-readable medium of claim 24, wherein the remediation recommendation includes a recommendation to adjust a substrate manufacturing tool.

26. The non-transient computer-readable medium of claim 22, wherein the plurality of dies is in a range from $1/1000$ to $1/50,000$ of a total number of dies of the substrate.

27. The non-transient computer-readable medium of claim 19, containing further instructions configured for causing the computing device to:
train a convolutional neural network machine learning model to provide the trained machine learning model, including to input training matrices to the machine learning model, each of the training matrices including a first dimension corresponding to different training dies, a second dimension corresponding to different spectra wavelengths, and a third dimension corresponding to different inspection channels, the training matrices including, for each of the different channels, values of reflected signal strengths of the different training dies at the different spectra wavelengths.

28. The non-transient computer-readable medium of claim 21, containing further instructions configured for causing the computing device to add one or more rows of data corresponding to the third spectra data to a matrix.

* * * * *